United States Patent [19]

Suzuki et al.

[11] Patent Number: 4,878,499
[45] Date of Patent: Nov. 7, 1989

[54] MAGNETIC RESONANCE IMAGING SYSTEM

[75] Inventors: Hirokazu Suzuki, Ootawara; Yoshio Machida, Tochigi; Yuji Yuasa, Tokyo, all of Japan

[73] Assignee: Kabushiki Kaisha Toshiba, Kawasaki, Japan

[21] Appl. No.: 256,110

[22] Filed: Oct. 11, 1988

Related U.S. Application Data

[63] Continuation of Ser. No. 24,528, Mar. 11, 1987, abandoned.

[30] Foreign Application Priority Data

Nov. 2, 1985 [JP] Japan .................................. 60-247799

[51] Int. Cl.⁴ .................................................. A61B 5/05
[52] U.S. Cl. ................................ 128/653 A; 128/721; 324/309
[58] Field of Search ................... 128/653, 721, 716; 324/307, 309; 378/8, 95

[56] References Cited

U.S. PATENT DOCUMENTS

| | | | |
|---|---|---|---|
| 3,871,360 | 3/1975 | Van Horn et al. | 378/95 |
| 3,993,995 | 11/1976 | Kaplan et al. | 128/653 |
| 4,182,311 | 1/1980 | Seppi et al. | 378/95 |
| 4,360,345 | 11/1982 | Hon | 434/428 |
| 4,387,722 | 6/1983 | Kearns | 378/95 |
| 4,443,760 | 4/1984 | Edelstein et al. | 324/309 |
| 4,530,109 | 7/1985 | Klausz | 378/95 |
| 4,545,384 | 10/1985 | Kawachi | 128/653 |
| 4,567,893 | 2/1986 | Charles et al. | 128/653 |

FOREIGN PATENT DOCUMENTS

| | | | |
|---|---|---|---|
| 2434639 | 2/1975 | Fed. Rep. of Germany | 378/95 |
| 3216273 | 11/1983 | Fed. Rep. of Germany | 128/653 |
| 0948370 | 8/1982 | U.S.S.R. | 378/95 |
| 2161275 | 1/1986 | United Kingdom | 324/307 |

OTHER PUBLICATIONS

Runge et al., "Respiratory Gating in Magnetic Resonance Imaging at 0.5 Tesla", Radiology, vol. 151, No. 2, pp. 521–523, 1984.

Ehman et al, "Magnetic Resonance Imaging with Respiratory Gating", AJR, vol. 143, pp. 1175–1182, Dec. 1984.

*Primary Examiner*—Ruth S. Smith
*Attorney, Agent, or Firm*—Foley & Lardner, Schwartz, Jeffery, Schwaab, Mack, Blumenthal & Evans

[57] ABSTRACT

In a magnetic resonance imaging system of this invention, a static magnetic field is applied to a patient, and a gradient magnetic field and an excitation pulse signal are applied to the patient in accordance with a predetermined pulse sequence, so as to cause a magnetic resonance phenomenon in a selected slice of the patient. The magnetic resonance data of the magnetic resonance phenomenon is acquired, and the magnetic resonance image is obtained from the magnetic resonance data. The system has an announcement section for intermittently urging the patient to stop a body movement. In this system, a data acquisition section is operated under the control of a control section only while the patient stands still in response to the announcement of the announcement section, thereby intermittently acquiring magnetic resonance data in units of a predetermined volume.

9 Claims, 6 Drawing Sheets

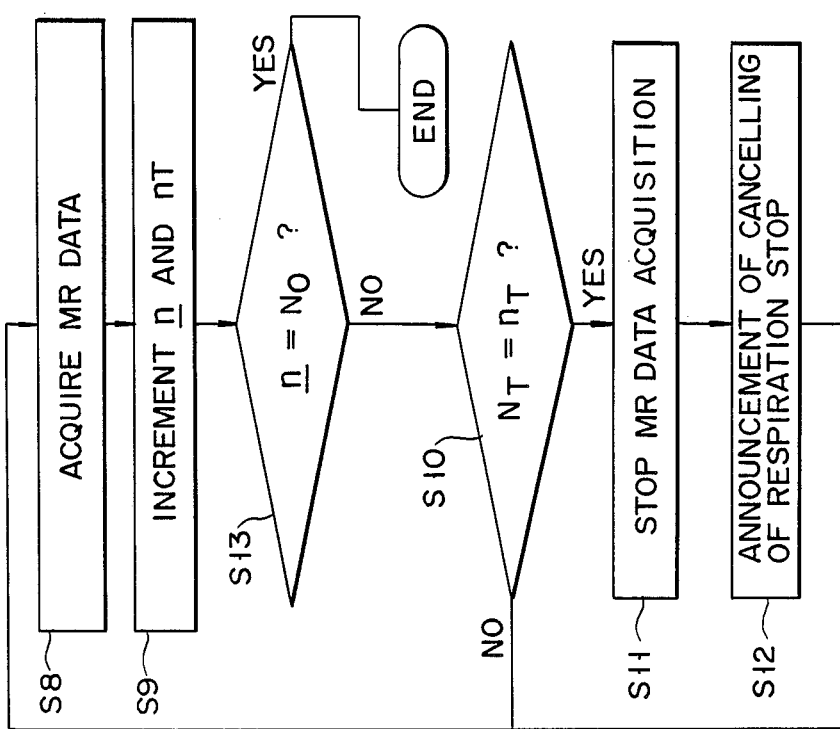
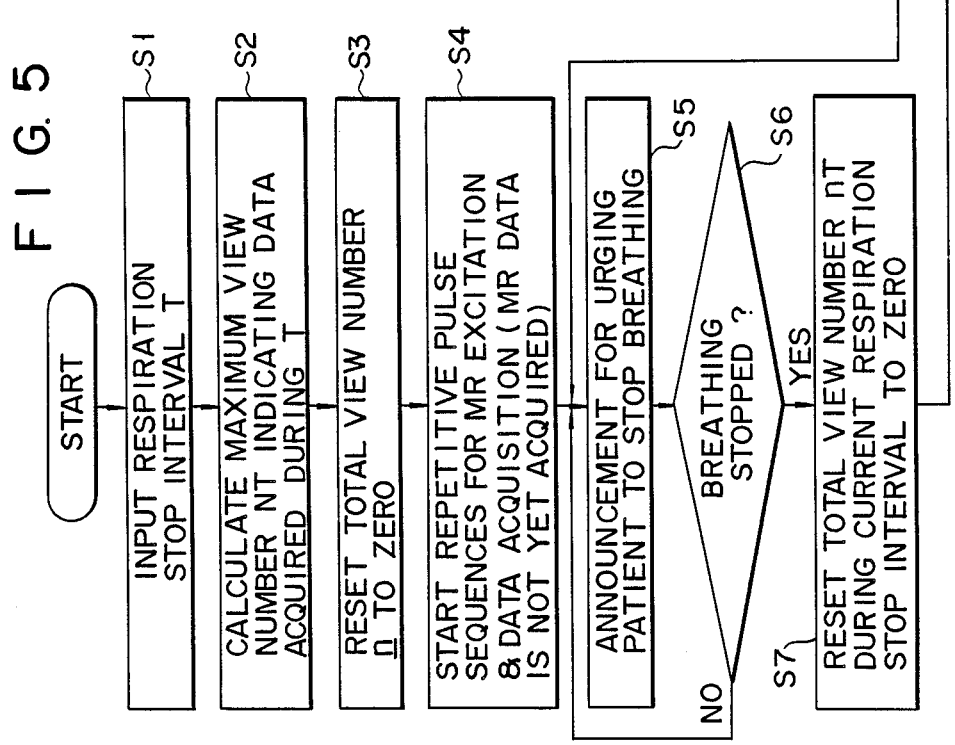
FIG. 5

MAGNETIC RESONANCE IMAGING SYSTEM

This application is a continuation of application Ser. No. 024,528, filed Mar. 11, 1987 now abandoned.

BACKGROUND OF THE INVENTION

The present invention relates to a magnetic resonance imaging (MRI) system for obtaining image information reflecting information of spin density and/or relaxation time of specific atomic nuclei present in an object to be examined using a magnetic resonance (MR) phenomenon and, more particularly, to a medical diagnosis MRI system for a human body, i.e., a patient as an object to be examined.

In an MRI system, a tomographic image in a selected slice of a patient is obtained as follows.

As shown in FIG. 1, very uniform static magnetic field H0 is applied to patient P. Thus field H0 extends in a z direction. Any atomic nucleus resonates in static magnetic field H0 at angular frequency W0 represented by the following equation:

$$\omega 0 = \gamma \cdot H0 \tag{1}$$

In equation (1), $\gamma$ is a gyromagnetic ratio. Gyromagnetic ratio $\gamma$ is unique to each type of atomic nucleus, and differs in accordance with the types of atomic nuclei.

A magnetic field gradient along the z axis, i.e., linear gradient magnetic field Gz having a magnetic field intensity distribution linearly proportional to displacement in the z direction, is superposed on static magnetic field H0 by a pair of gradient coils 1A and 1B. (Linear gradient magnetic field Gz also has the direction of magnetic field, i.e., the direction of field line along the z direction.) Linear gradient magnetic field Gz has magnetic field intensities which are different for each displacement along the z axis. Thus, for example, an x-y plane portion in FIG. 1, i.e., specific slice portion S (although it looks like a planar portion, it has a certain thickness in practice) has a predetermined magnetic field intensity due to, e.g., only static magnetic field H0 if the field intensity due to gradient field Gz at slice portion S is zero (the field intensity due to gradient field Gz gradually increases on one side of slice portion S and gradually decreases on the other side of slice portion S, in accordance with displacement in Z-direction). More specifically, a slice for obtaining a tomographic image can be selectively determined by linear gradient magnetic field Gz.

Rotating magnetic field H1 at angular frequency $\omega 0$ for resonating only specific nuclei is applied to patient P to be superposed on static magnetic field H0 and gradient magnetic field Gz through a pair of transmission coils 2A and 2B arranged on a probe head. In this way, rotating magnetic field H1 acts on only on slice portion S which is selectively determined by linear gradient magnetic field Gz, and the MR phenomenon is caused in slice portion S.

The MR phenomenon is observed as an MR signal through a pair of receiving coils 3A and 3B arranged on the probe head. The observed MR signal is Fourier transformed, thereby obtaining a unique spectrum for the angular frequency of the specific atomic nucleus spin.

In order to obtain a tomographic image by image reconstruction, an MR signal including positional information for x and y directions in the x-y plane of slice portion S must be generated. For this purpose, frequency and phase information is used as media of positional information in the MR signal.

As shown in FIG. 2A, after slice portion S is excited to cause the MR phenomenon, a magnetic field gradient along the y axis, i.e., linear gradient magnetic field Gy having a magnetic field intensity distribution linearly proportional to displacement in the y direction, is superposed on static magnetic field H0. (Linear gradient magnetic field Gy also has the direction of magnetic field, i.e., the direction of field line along the z direction.) In the MR phenomenon, phase difference $\phi y$, represented by the following equation, due to linear gradient magnetic field Gy is caused for the displacement in the y direction:

$$\phi y = \gamma \cdot Gy \cdot y \cdot \tau = \omega y \cdot \tau \tag{2}$$

Causing a phase difference upon application of a gradient magnetic field, in this manner, is called "phase encoding".

When an MR signal is detected while superposing a gradient magnetic field along the x axis, i.e., linear gradient magnetic field Gx having a magnetic field intensity linearly proportional to displacement in the x direction on static magnetic field H0 (linear gradient magnetic field Gx also has the direction of magnetic field, i.e., the direction of field line along the z direction), the MR signal causes linear frequency difference $\omega x$ represented by the following equation for the displacement in the x direction:

$$\omega x = \gamma \cdot Gx \cdot x \tag{3}$$

MR excitation and MR signal acquisition as above are repeated n times. Upon repetition, phase encoding linear gradient magnetic field Gy is changed for each cycle, and $\phi y$ given by equation (2) is varied for each cycle. For example, signals corresponding to positions A, B, and C in FIG. 2A are obtained in accordance with the first gradient magnetic field Gy, as shown in the upper left part of FIG. 2B, signals corresponding to positions D, E, and F in FIG. 2A are obtained in accordance with the second Gy, as shown in the left middle part of FIG. 2B, and signals corresponding to positions G, H, I in FIG. 2A are obtained in accordance with the third Gy, as shown in the lower left part of FIG. 2B, thereby obtaining signal F (t,n) (the right part of (FIG. 2B) represented by the following equation:

$$F(t,n) = \int_{-\infty}^{\infty} \int_{-\infty}^{\infty} \rho(\omega x, \omega y) e^{j(\omega x \cdot t + \phi y \cdot n)} d\omega x d\phi y \tag{4}$$

Note that $\rho(\omega x, \omega y)$ in equation (4) is the frequency spectrum of signal F(t,n). When signal F(t,n) is two-dimensionally Fourier transformed, $\rho(\omega x, \omega y)$ is obtained, and a tomographic image in slice portion S can be reconstructed. Such an imaging operation is called a "two-dimensional Fourier transformation (2DFT) method".

However, the MRI system employing the 2DFT method requires several minutes or more for acquiring MR data necessary for image reconstruction. For this reason, a patient cannot hardly stand still while MR data necessary for image reconstruction is acquired. In the MRI system employing the 2DFT method, artifacts caused by the body movement of the patient due to, e.g., his respiration, during MR data acquisition are formed on the resultant MR image. The artifacts caused by the body movement are so-called ghost-like artifacts occurring in a direction corresponding to the phase encoding direction on the MR image.

Contrary to this, a high-speed imaging method in which image reconstruction is performed using MR data obtained in a very short period has been developed. Such a high-speed imaging method cannot obtain an MR image having a good quality, e.g., good contrast, compared to a low-speed imaging method such as the 2DFT method.

SUMMARY OF THE INVENTION

It is an object of the present invention to provide an MRI system which can obtain a clear, high-quality MR image which is very effective for diagnosis and is free from artifacts caused by the body movement, such as respiration, of a patient.

In an MRI system of the present invention, an MR signal obtained by causing the MR phenomenon in a patient is derived as view data for each cycle of MR excitation and signal acquisition, and an MR image of the patient is reconstructed based on the view data of a plurality of views. In this MRI system, the patient is intermittently caused to stand still, and view data of a predetermined number of views are acquired during each still interval, thereby acquiring view data of the number of views necessary for reconstructing the MRI image of the patient.

According to the MRI system of the present invention, since view data of a predetermined number of views are acquired while a patient is intermittently caused to stand still, a clear, high-quality MR image which is very effective for diagnosis and is free from artifacts caused by the body movement, such as respiration, of a patient, can be obtained.

BRIEF DESCRIPTION OF THE DRAWINGS

FIG. 5 is a flow chart for explaining an operation of a system according to a second embodiment of the present invention.

DETAILED DESCRIPTION OF THE PREFERRED EMBODIMENTS

An MRI system according to an embodiment of the present invention will now be described hereinafter in detail.

Figure 1:
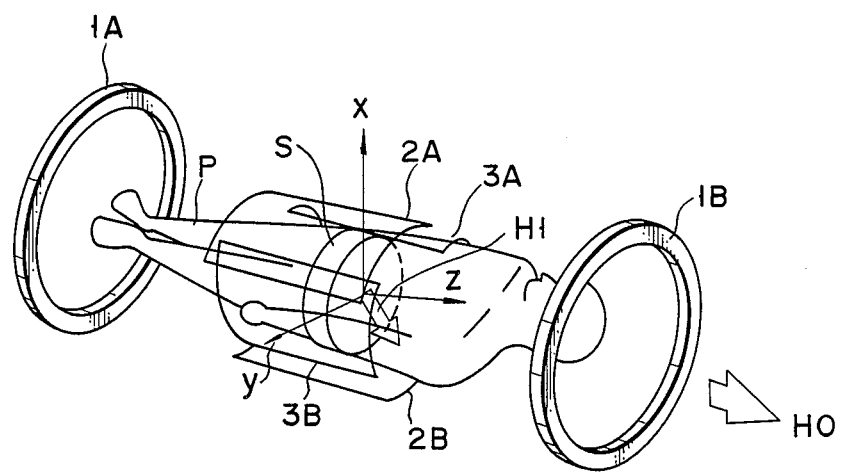
FIG. 1 is a view for explaning the principle of an MRI system.
Figure 2A:
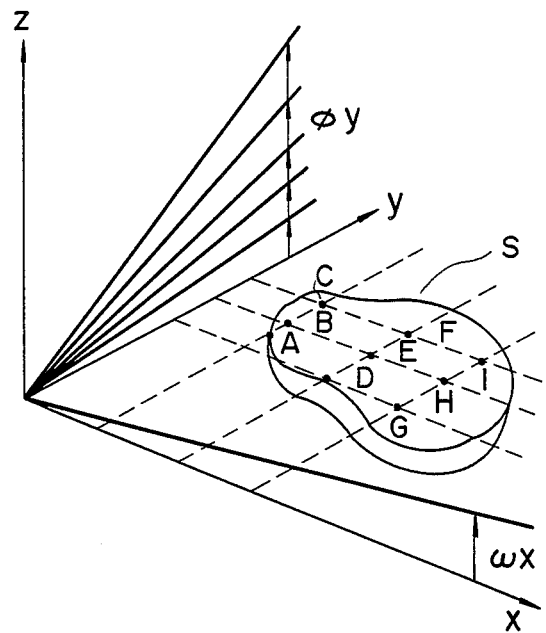
FIGS. 2A and 2B are views for explaining an MR signal in the MRI system shown in FIG. 1.
Figure 2B:
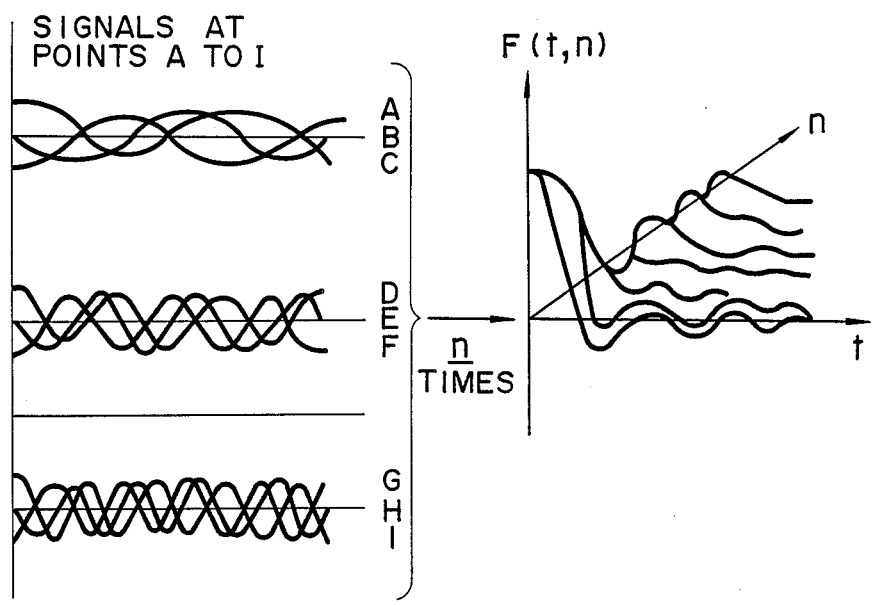
Figure 3:
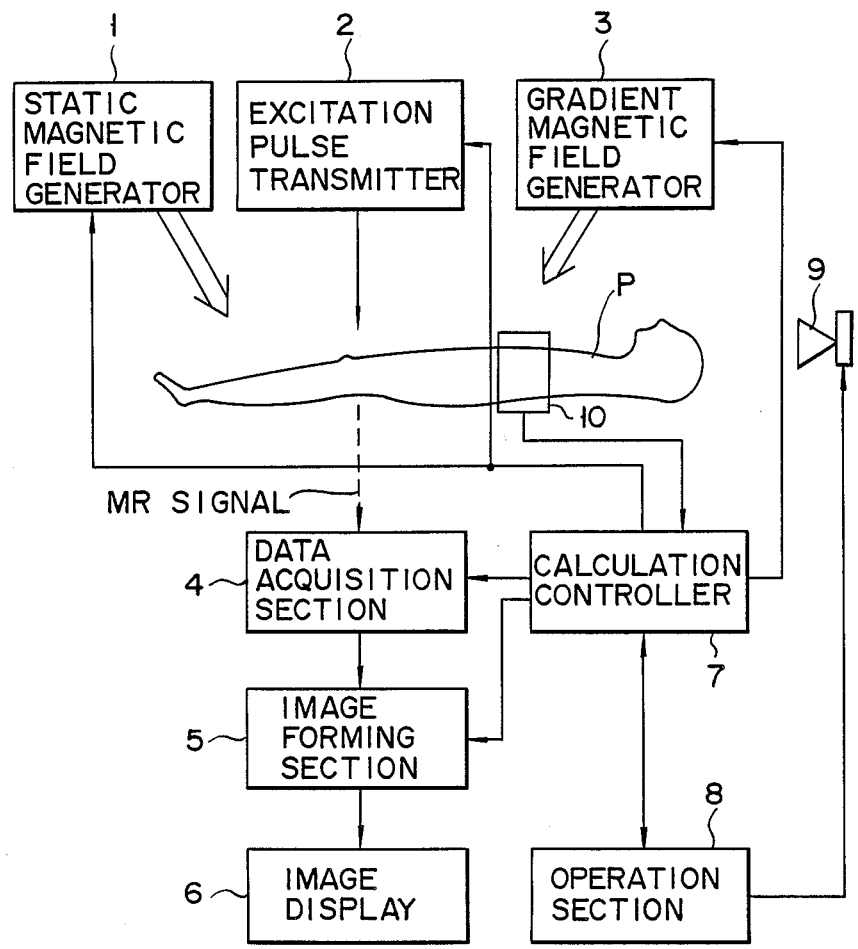
FIG. 3 is a block diagram showing the arrangement of an MRI system according to a first embodiment of the present invention.

FIG. 3 shows the arrangement of the MRI system according to the first embodiment of the present invention.

The MRI system shown in FIG. 3 comprises static magnetic field generator 1, excitation pulse transmitter 2, gradient magnetic field generator 3, data acquisition section 4, image forming section 5, image display 6, calculation controller 7, operation section 8, loudspeaker 9, and respiration detector 10.

Static magnetic field generator 1 generates uniform static magnetic field H0, and applies it to patient P. Excitation pulse transmitter 2 generates an excitation pulse signal consisting of a radio frequency (RF) rotating magnetic field or RF oscillation magnetic field at a predetermined frequency for exciting magnetic resonance, and applies the excitation pulse to patient P. Gradient magnetic field generator 3 generates a gradient magnetic field which is applied to patient P to be superposed on static magnetic field H0. Data acquisition section 4 fetches an MR signal based on the MR phenomenon excited in patient P as view data.

Data acquisition section 4 executes view data acquisition while patient P stops breathing, and interrupts view data acquisition when patient P takes a breath. For this purpose, data acquisition section 4 is controlled by calculation controller 7 in accordance with the detection output from respiration detector 10, as will be described later. In data acquisition section 4, data corresponding in number to views necessary for obtaining an MR image of patient P are intermittently acquired for a predetermined number of views. Note that "view" means a set of MR signals having a given phase encoding amount, and corresponds to "projection" used in an X-ray CT system.

Image forming section 5 fetches the view data received by data acquisition section 4, and reconstructs the MR image of patient P. Image display 6 displays the MR image reconstructed by image forming section 5 as a visual image.

Calculation and control section (hereinafter referred to as controller) 7 includes a CPU (Central Processing Unit), and controls the overall operation of this system. Static magnetic field generator 1, excitation pulse transmitter 2, gradient magnetic field generator 3, data acquisition section 4, and image forming section 5 are under the control of controller 7. Operation section 8 is operated by an operator, and supplies various commands and/or information for this system to controller 7 and loudspeaker 9. Loudspeaker 9 is used for providing a message for urging patient P to stop breathing from operation section 8. From loudspeaker 9, an announcement "take a deep breath and stop breathing" or "control breathing and relax" is made. This announcement can be directly made by the operator through a microphone or can be made by a voice reproduced from a recorded tape or a synthetic voice from a voice synthesizer system. Controller 7 receives the output from respiration detector 10. Respiration detector 10 comprises a belt-like air bag wound around the thorax of patient P and a pressure detector coupled to the air bag, and detects respiration of patient P (whether patient P takes a breath or stops it).

The operation and effect of the MRI system having the arrangement as shown in FIG. 3 will be described with reference to the flow chart shown in FIG. 4.

Prior to the MRI operation, a maximum duration while patient P can easily stop breathing is estimated or determined in advance as a maximum respiration stop duration. When the MRI processing starts, the operator inputs, from operation section 8, the above maximum respiration stop duration as single respiration stop interval T (step S1). Controller 7 calculates the maximum number of views (i.e., maximum view number NT), which can be acquired during input respiration stop interval T (step S2).

Maximum view number NT can be calculated by the following calculation if a pulse sequence repetition time is given as $T_R$ and the number of times of MR data additions is given as $N_{AV}$. (Upon MR data acquisition, an arithmetic mean of data obtained through a plurality of times of MR data acquisition in an identical view often is calculated, and an S/N ratio of acquired data is improved as MR data of the view. In this case, the number of times of additions for averaging MR data is $N_{AV}$.)

$$N_T = T/(T_R \times N_{AV}) \tag{5}$$

In calculation controller 7, a software counting function (to be referred to as an n counter hereinafter) of the number n of views for which MR signals have been acquired at that time is cleared to zero (step S3), and repetitive applications of the static magnetic field, the gradient magnetic field, and the excitation pulse signal are executed (step S4) in the pulse sequence determined by the 2DFT method. At this time, MR signal (view data) acquisition is not performed.

The operator then makes an announcement to tell patient P to stop breathing (e.g., an announcement of "take a deep breath and stop breathing") (step S5). It is checked based on the output from respiration detector 10 if breathing of patient P has stopped (step S6). If it is detected in step S6 that breathing of patient P has not stopped yet, the flow returns to step S5, and the announcement for stopping breathing is made again. If it is detected in step S6 that patient P stopped breathing, controller 7 recognizes that patient P is in respiration stop interval, and a software counting function (to be referred to as an nT counter hereinafter) of the number nT of views for which MR signals have been acquired at that time during the current respiration stop interval is cleared to zero (step S7). Controller 7 drives data acquisition section 4, and acquires the MR signals detected from patient P as view data (step S8).

The pulse sequence upon data acquisition of this system will be described below. The pulse sequence is executed under the control of calculation controller 7.

Patient P is placed in uniform static magnetic field H0 along the z direction produced by static magnetic field generator 1, so that the body axis direction of patient P is oriented in the z direction. The excitation pulse signal is applied to patient P by excitation pulse transmitter 2, and slice portion S corresponding to a desired slice of patient P is selectively excited. Thereafter, linear gradient magnetic field Gx having a linear magnetic field gradient in the x direction is applied, and the MR signals are then detected while linear gradient magnetic field Gx is kept applied. In this manner, a single pulse sequence is completed.

Upon completion of the single pulse sequence, controller 7 increments values of n counter and nT counter by one, respectively (step S9). More specifically, the total number n of views for which the MR signals have been obtained at that time, and the number nT of views for which the MR signals have been obtained at that time during the current (first) respiration stop interval are incremented by one, respectively. Controller 7 checks if maximum view number $N_T$ during the single respiration stop interval is equal to the number $n_T$ of views obtained during current respiration stop interval T (step S10). If it is determined in step S10 that $N_T$ is not equal to $n_T$, in other words, only when the relation of $N_T > n_T$ is established and the relation of $N_T = n_T$ is not established, the flow returns to step S8, and MR data acquisition is continued.

In the case of the 2DFT method, in the second pulse sequence and thereafter (if an arithmetic mean of data is calculated in an identical view, in a second view and thereafter), phase encoding linear gradient magnetic field Gy is applied in the y direction to cause a phase difference among spins. Linear gradient magnetic field Gx is then applied in the x direction and MR signals are detected. The phase difference among spins, i.e., a level or an application time width of gradient of phase encoding linear gradient magnetic field Gy, must be increased in accordance with the number of times of pulse sequences. Of course, phase encoding linear gradient magnetic field Gy for determining a phase difference among spins is controlled by controller 7.

The view data is sequentially acquired by the above-mentioned pulse sequence. As a result, if it is determined in step S10 that $N_T = n_T$, this means single respiration stop interval T is expired. Thus, if it is determined in step S10 that $N_T = n_T$, controller 7 immediately stops MR signal acquisition (view data acquisition) (step S11). Then, the operator performs the announcement of, e.g., "control breathing and relax" (step S12). This announcement can be made, through a microphone, by the operator who confirms by an indicator (not shown) arranged on operation section 8 that the MR signal acquisition is interrupted. Alternatively, this can be made by a sound system (not shown) under the control of controller 7. Note that when step S11 is executed, the pulse sequence is kept repetitively executed under the control of controller 7 after the MR signal acquisition is interrupted.

Controller 7 checks if the obtained number n of views has reached view number No necessary for obtaining an MR image (step S13). No is a known value, and is preset. n is a count value of the n counter in controller 7, as described above. Therefore, if it is determined in step S13 that No is not equal to n ($N_o > n$), the flow returns to step S5, and the announcement requesting respiration stop is made to perform MR data acquisition. If it is determined in step S13 that $N_o$ is equal to n ($N_o = n$), the imaging operation is ended. The MR image of patient P is reconstructed by image forming section 5 based on the view data acquired as described above, and the reconstructed MR image is displayed on display 6. Image reconstruction processing in image forming section 5 and reconstructed image display processing by image display 6 are the same as those in the conventional system, and a detailed description thereof is omitted.

As described above, in this system, respiration stop and its cancelling are repetitively instructed to patient P through loudspeaker 9, and view data of a proper number of views are acquired only while patient P stops breathing. Unlike a conventional system which acquires view data irrespective of the body movement caused by respiration of patient P, since view data can be intermittently acquired in units of a predetermined number of views while patient P stops breathing, a high-quality MR image which is free from ghost-like artifacts in the phase encoding direction and is very effective for diagnosis can be obtained.

The MRI system according to the first embodiment of the present invention has been described. The present invention is not limited to the above embodiment, and various changes and modifications may be made.

For example, in the above system, when it is confirmed through respiration detector 10 that patient P stopped breathing after the announcement of respiration stop, MR data acquisition by data acquisition section 4 is automatically started upon operation of controller 7. However, MR data acquisition by data acquisition section 4 can be started by a manual operation of the operator in accordance with either of the following methods. When it is detected through respiration detector 10 that patient P stopped breathing, this is indicated by a respiration stop indicator arranged on operation section 8. When the operator confirms this and operates a data acquisition start button arranged on operation section 8, an MR data acquisition start instruction can be supplied to data acquisition section 4 through controller 7.

Figure 4:
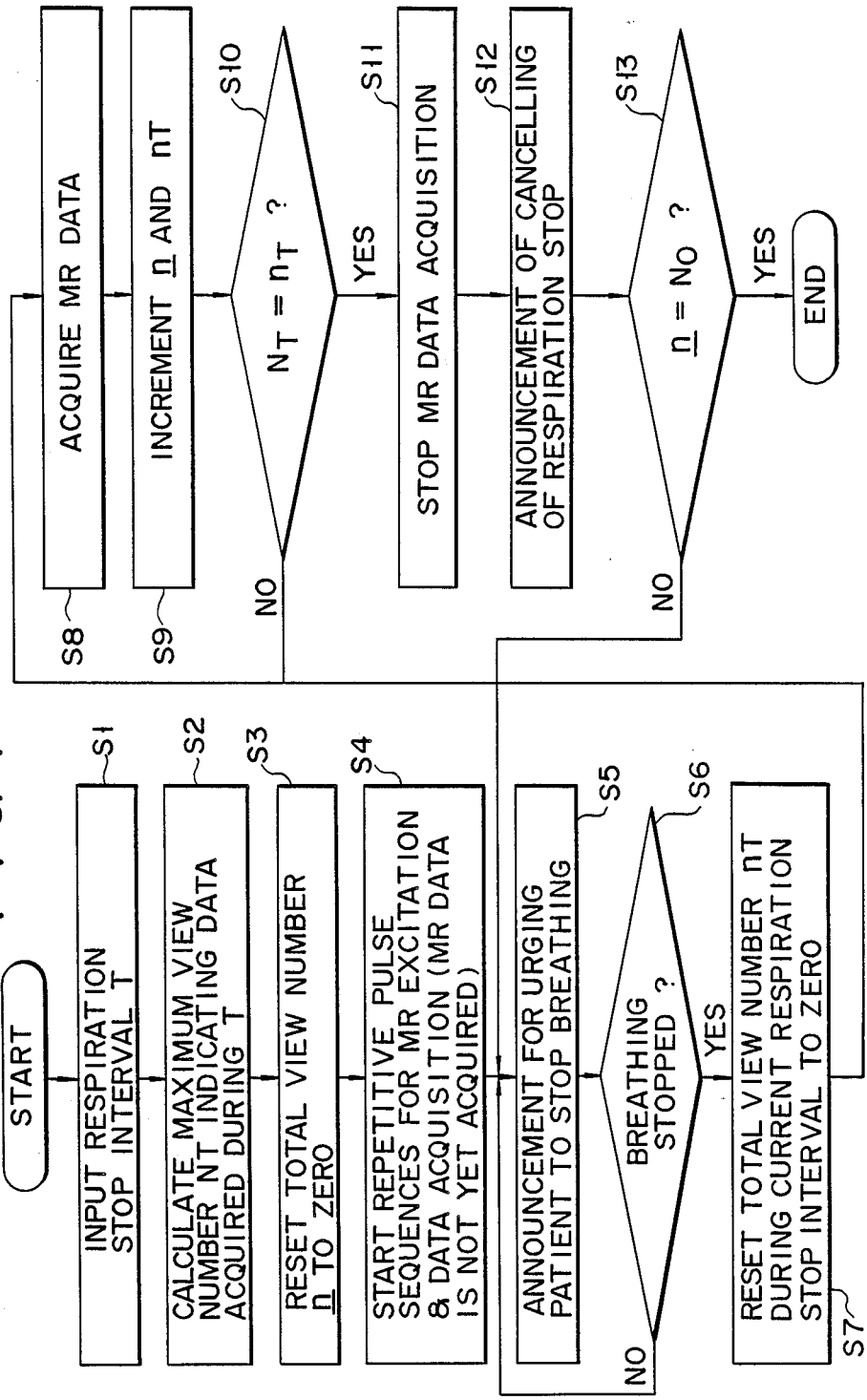
FIG. 4 is a flow chart for explaining the operation of the system shown in FIG. 3.

In the flowcharts of FIGS. 4 and 5, the announcement (S5, S12) to an object may be automatically produced by operation section 8 in accordance with a sequence of predetermined control steps, not by manual operation by an operator.

In the flow chart shown in FIG. 4, discrimination of step S13 is executed after discrimination of step S10 is completed. However, as shown in FIG. 5, discrimination of step S13 can be executed immediately before step S10. When n reaches $N_o$ in this case, even if $N_o$ is not an integer multiple of $N_T$, the imaging operation can be immediately ended irrespective of the discrimination result of step S10. Thus, since unnecessary view data cannot be acquired, a time required for imaging can be shortened. In the flowcharts of FIGS. 4 and 5, the announcement (S5, S12) to an object may be automatically produced by operation section 8 in accordance with a sequence of predetermined control steps, not by manual operation by an operator.

Figure 6:
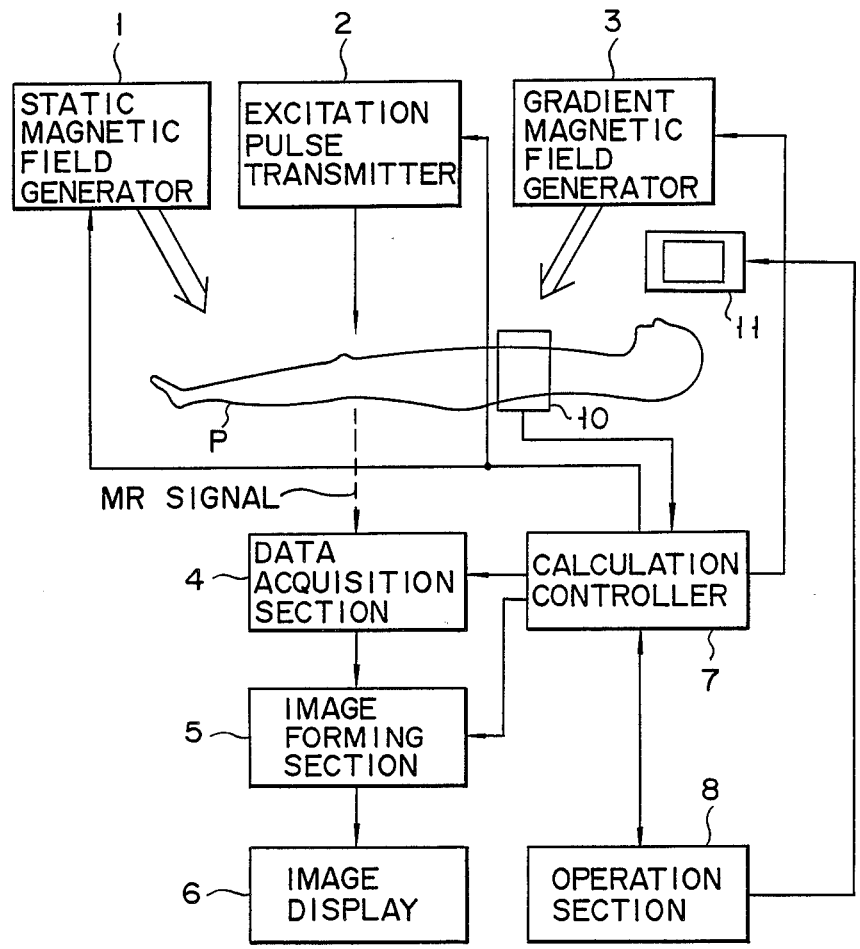
FIG. 6 is a block diagram showing the arrangement of a system according to a third embodiment of the present invention.

The content of message for patient P can be modified like "let out breath and stop breathing" for urging patient to stop breathing. A buzzer can be used instead of loudspeaker 9 shown in FIG. 3, and an instruction to patient P can be made by means of a predetermined sound or a duration of a sound. Alternatively as shown in FIG. 6, indicator section 11 for displaying an instruction to patient P by turning on light-emitting elements (e.g., respiration stop and start are instructed in accordance with a color of light) or by character representation can be arranged in the field of view of patient P.

The present invention is not limited to the 2DFT method, but can be applied to other imaging methods, e.g., a back projection method.

The present invention can be embodied as a system for preventing degradation in image quality caused by body movements other than respiration. For example, in a system for preventing degradation in image quality due to "blinking" when an MR image of a cornea region is obtained, instructions "do not blink", "relax", and the like are provided to patient P.

What is claimed is:

1. In a magnetic resonance imaging system which comprises static magnetic field generation means for generating a static magnetic field, gradient magnetic field generation means for generating a gradient magnetic field, excitation means for applying an excitation pulse signal, data acquisition means for acquiring magnetic resonance data, image forming means for forming a magnetic resonance image based on the magnetic resonance data, and control means for controlling said static magnetic field generation means, said gradient magnetic field generation means, said excitation means, and said data acquisition means at a predetermined timing, and in which the static magnetic field is applied to an object to be examined, the gradient magnetic field and the excitation pulse signal are applied to the object to be examined in accordance with a predetermined pulse sequence, so as to cause a magnetic resonance phenomenon in a selected portion of the object to be examined, the magnetic resonance data of the magnetic resonance phenomenon is acquired by said data acquisition means, and the magnetic resonance image is obtained from the magnetic resonance data by said image forming means, the improvement comprising:

direction means for intermittently directing the object to be examined to keep still; and acquisition control means for causing said data acquisition means to repeat a data acquisition operation a number of times for acquiring the magnetic resonance data necessary for reconstruction of the magnetic resonance image of the object to be examined, each data acquisition operation being performed only while said object remains still in response to said direction from said direction means, for collecting a predetermined quantity of magnetic resonance data, said predetermined quantity being set prior to the data acquisition in accordance with the duration in which the object to be examined remains still.

2. A system according to claim 1, wherein said direction means is an automatic announcement means for automatically urging the object to be examined to halt a body movement and to release the halting of the body movement at a predetermined timing.

3. A system according to claim 2, wherein said automatic announcement means includes voice announcement means for announcing a message for urging the object to be examined to halt a body movement and to release the halting of the body movement by means of voice.

4. A system according to claim 2, wherein said automatic announcement means includes visual display means for visually urging the object to be examined to halt a body movement and to release the halting of the body movement.

5. A system according to claim 1, wherein said direction means is manual announcement means for urging the object to be examined to halt a body movement and to release the halting of the body movement upon operation of an operator.

6. A system according to claim 5, wherein said manual announcement means includes voice transmission means for transmitting a voice of an operator to the object to be examined.

7. A system according to claim 1, further comprising still detection means for detecting that the object to be examined keeps still, and wherein said data acquisition means is responsive to said still detection means.

8. A magnetic resonance imaging system comprising:
   static magnetic field generation means for applying a static magnetic field to an object to be examined,
   gradient magnetic field generation means for generating a gradient magnetic field,
   means for applying an excitation pulse correlated with said gradient field to said object so as to cause a selected portion of said object to produce magnetic resonance data of the magnetic resonance phenomenon, means for collecting magnetic resonance data, means for forming a magnetic resonance image based on the magnetic resonance data, means for directing said object to halt its physical movement for a predetermined interval; and means for controlling said data collecting means to collect the magnetic resonance data while said movement of the object is halted, and to repeat said collection of data correlated with said halting of the movement a predetermined number of times in accordance with said predetermined interval, until the requisite resonance data for forming said magnetic resonance image is obtained.

9. In a magnetic resonance imaging system which comprises static magnetic field generation means for generating a static magnetic field, gradient magnetic field generation means for generating a gradient magnetic field, excitation means for applying an excitation pulse signal, data acquisition means for acquiring magnetic resonance data, image forming means for forming a magnetic resonance image based on the magnetic resonance data, and control means for controlling said static magnetic field generation means, said gradient magnetic field generation means, said excitation means, and said data acquisition means at a predetermined timing, and in which the static magnetic field is applied to an object to be examined, the gradient magnetic field and the excitation pulse signal are applied to the object to be examined in accordance with a predetermined pulse sequence, so as to cause a magnetic resonance phenomenon in a selected portion of the object to be examined, the magnetic resonance data of the magnetic resonance phenomenon is acquired by said data acquisition means, and the magnetic resonance image is obtained from the magnetic resonance data by said image forming means, the improvement comprising:

means for determining a respiration suspension time interval during which the object to be examined may remain with respiration suspended;

means for calculating a predetermined quantity of MR data which can be determined during said time interval;

direction means for intermittently directing the object to be examined to keep still at the beginning of said time interval;

acquisition control means for causing said data acquisition means to repeat a data acquisition operation a number of times for acquiring the magnetic resonance data necessary for reconstruction of the magnetic resonance image of the object to be examined, each data acquisition operation being performed only while said object remains still in response to said direction from said direction means, for collecting said predetermined quantity of magnetic resonance data; and means for directing said object to continue respiration at the end of said interval.

* * * * *

UNITED STATES PATENT AND TRADEMARK OFFICE
CERTIFICATE OF CORRECTION

PATENT NO. : 4,878,499

DATED : November 7, 1989

INVENTOR(S) : Hirokazu SUZUKI

It is certified that error appears in the above—identified patent and that said Letters Patent is hereby corrected as shown below:

On the face of the patent, delete Item No. [30].

Signed and Sealed this

Seventeenth Day of December, 1991

Attest:

HARRY F. MANBECK, JR.

Attesting Officer

Commissioner of Patents and Trademarks